United States Patent [19]

Gordon et al.

[11] Patent Number: 4,645,280
[45] Date of Patent: Feb. 24, 1987

[54] SOLDERLESS CONNECTION TECHNIQUE BETWEEN DATA/SERVO FLEX CIRCUITS AND MAGNETIC DISC HEADS

[75] Inventors: Herman B. Gordon, Phoenix, Ariz.; Bernard J. Carey, Schenectady, N.Y.

[73] Assignee: Rogers Corporation, Rogers, Conn.

[21] Appl. No.: 763,904

[22] Filed: Aug. 8, 1985

[51] Int. Cl.⁴ .............................................. H01R 9/09
[52] U.S. Cl. .................................... 339/17 F; 360/104
[58] Field of Search ........... 339/17 F, 176 MF, 75 M, 339/75 MP; 360/102, 103, 104

[56] References Cited

U.S. PATENT DOCUMENTS

| | | | |
|---|---|---|---|
| 4,309,732 | 1/1982 | Kronfeld et al. | 360/104 |
| 4,432,027 | 2/1984 | Higuchi | 360/104 |
| 4,538,865 | 9/1985 | Wakabayashi et al. | 339/17 F |

FOREIGN PATENT DOCUMENTS

| | | | |
|---|---|---|---|
| 52-9417 | 1/1977 | Japan | 360/103 |
| 55-25803 | 2/1980 | Japan | 360/104 |

OTHER PUBLICATIONS

IBM Bulletin, Reich, vol. 13, No. 9, p. 2641, 2–1971.
IBM Bulletin, Dunman, vol. 20, No. 5, p. 1984, 10–1977.

*Primary Examiner*—Neil Abrams
*Attorney, Agent, or Firm*—Fishman & Dionne

[57] ABSTRACT

A technique for providing a solderless connection between data/servo flex circuits and magnetic heads in disc drives is presented. The solderless connection is particularly well suited for making the electrical connection between a thin film head on one end of a Whitney Suspension Mechanism (WSM) and a flex circuit which is at the other end of the WSM.

33 Claims, 6 Drawing Figures

FIG. 1
(PRIOR ART)
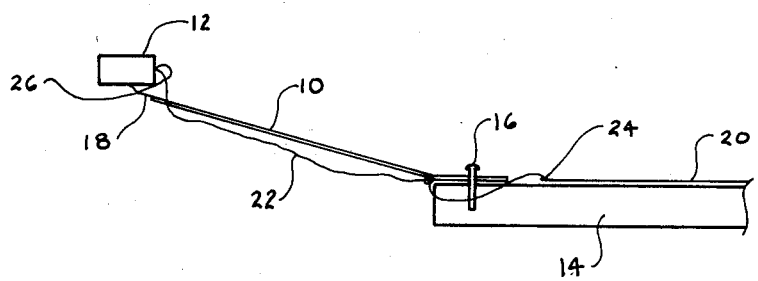
FIG. 2A
FIG. 2B
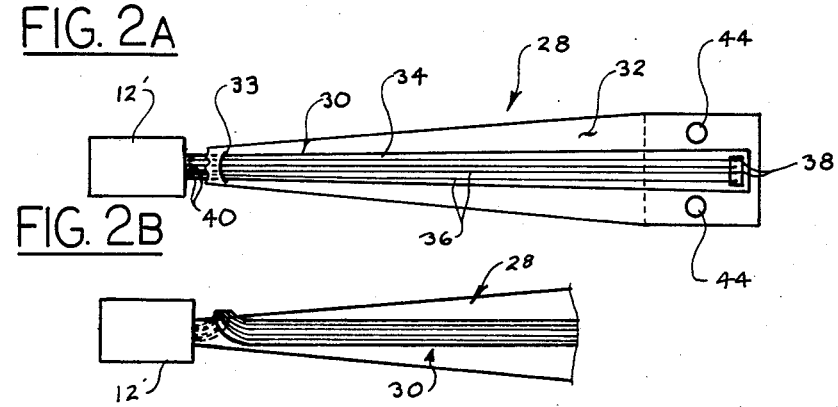
FIG. 3
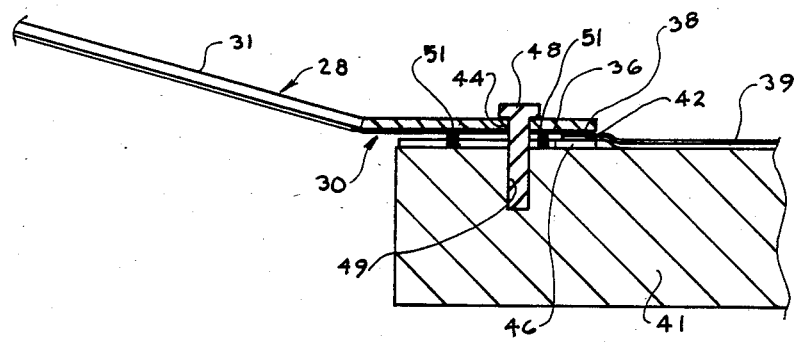

SOLDERLESS CONNECTION TECHNIQUE BETWEEN DATA/SERVO FLEX CIRCUITS AND MAGNETIC DISC HEADS

BACKGROUND OF THE INVENTION

This invention relates to electrical connections between data/servo flex circuits and magnetic heads in a disc drive. More particularly, this invention relates to a novel technique for effecting electrical connections between a thin film head on one end of a Whitney Suspension Mechanism (WSM) and a flex circuit which is at the other end of the WSM. The novel electrical connection provides an industry standard assembly which may be used by different disc drive manufacturers and involves the use of a controlled impedance flexible circuit and a matched impedance solderless connection.

The Whitney Suspension Mechanism (WSM) is also known as the Whitney Flexure. It is a small spring-steel suspension arm approximately 1 inch long. It is simpler and more stable than Winchester flexures which have preceded the WSM. The WSM is a delicate structure with special aerodynamic and mechanical properties which ensure that the thin film head is reliably positioned at a precise distance and orientation with respect to the surface of a rigid, rotating disc in a magnetic memory.

Typically, the WSM is attached to a rigid arm which is controlled by an electro-mechanical servo-mechanism. The arm is normally constructed of aluminum. During operation, the motion of the arm positions the magnetic head over a given track on the disc, while the WSM positions the magnetic head at a given distance and orientation relative to the disc surface.

Usually, a flexible printed circuit is bonded to this rigid arm. The flexible circuit provides a set of conductive leads which define electrical paths for the transmission of electrical signals between the thin film head and the electronic components in the disc system control. Typically, an integrated circuit and certain passive components, are soldered to the flexible circuit near the end of the arm to (1) control the operation of the thin film head; and (2) condition the signals to permit reliable transmissions of the signals from the thin film head through the flexible circuit to the memory system controller. The thin film heads, rotating disc, arms, flexible circuits, servo mechanism and other related components are all contained within a sealed chassis referred to as the Head Disc Assembly (HDA). This seal chassis is necessary because the thin film head "flys" within a few microns of the rotating disc surface. Consequently, any contaminants within the system would act to foul the head/disc interface and disrupt the operation of the disc drive.

Currently, thin film heads of the type hereinabove discussed have three electrical connections to provide for the reading and writing functions. Future thin film heads for use with vertical recording methods may require more connections and possibly up to ten. Under present connection practice, the electrical connections between the thin film head and the arm flex circuit are made with very fine, i.e., #42 wire, which are soldered to pads at both ends. This is a manual operation resulting in high labor and assembly costs. Moreover, the very thin wires are small, fragile and easily damaged during assembly. As mentioned, reliability and contamination of the HDA are serious problems. The small connective wires are generally twisted into a small bundle. This wire bundle has undesirable electronic properties for signal transmission. Also, repair of the arm assembly is difficult because of the unsoldering and soldering which must occur (and which may contaminate the HDA). Typically, the entire arm assembly must be thrown away because of the difficulty of repair or damage occurring during the repair. As a consequence, replacement and repair costs of the date/servo flex circuit and magnetic head are quite high.

SUMMARY OF THE INVENTION

The above discussed and other problems of the prior art are overcome or alleviated by the novel technique for effecting electrical connection between data/servo flex circuits and magnetic heads of the present invention.

In accordance with the present invention, the bundle of small, fine wires which interconnect (via a soldered connection) the magnetic head to the flexible circuit on the arm, is replaced by a controlled impedance flexible circuit for transmission of signals between the thin film head and the arm flexible circuit. This controlled impedance flexible circuit and the arm flexible circuit are interconnected using an elastomeric solderless connector of the type described in U.S. Pat. No. 4,468,074. A solderless connection of this type provides a mechanically reliable connection, rapid assembly and disassembly and matched impedance connection to the arm flexible circuit. As will be discussed in greater detail hereinafter, the elimination and replacement of the small bundle of wires to the head by the solderless connection of the present invention provides a connector having increased reliability, better electronic characteristics, faster assembly and disassembly, and lower contamination along with lower assembly and repair costs.

DESCRIPTION OF THE DRAWINGS

Referring now to the drawings, wherein like elements are numbered alike in the several FIGURES:

FIG. 1 is a side elevation view of a data/servo to magnetic head interconnection on a Whitney Suspension Mechanism (WSM) in accordance with the prior art;

FIG. 2A is a bottom view of a data/servo to magnetic head interconnection of a WSM in accordance with the present invention;

FIG. 2B is a bottom view, similar to FIG. 2A, of another embodiment of a data/servo to magnetic head interconnection of a WSM in accordance with the present invention;

FIG. 3 is an enlarged side elevation view of a portion of the WSM of FIG. 2A;

DESCRIPTION OF THE PREFERRED EMBODIMENT

Figure 4:
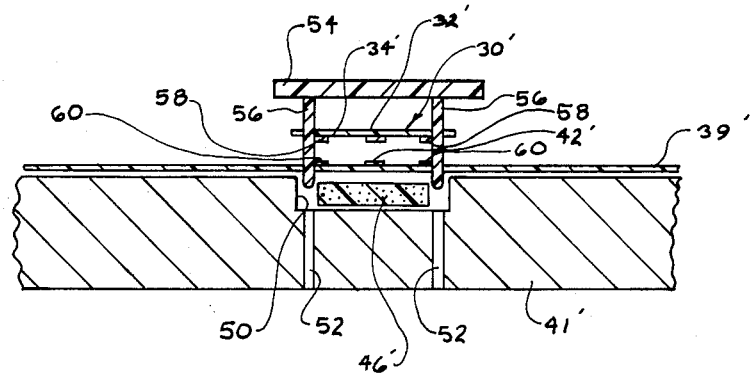
FIG. 4 is a cross-sectional elevation view of a portion of the data/servo to magnetic head interconnection on a WSM in accordance with another embodiment of the present invention.

Referring first to FIG. 1, a portion of a Whitney Suspension Mechanism (WSM) is shown in accordance with the prior art wherein a bundle of individual wires are used for making electrical connections between a thin film head and the arm flexible circuit. In FIG. 1, the WSM, which consists of a spring steel suspension arm, is shown generally at 10 and mechanically interconnects a thin film head 12 to a rigid arm 14; arm 14 being controlled by an electro-mechanical servo mechanism (not shown). WSM 10 connects to rigid arm 14 via a pair of bolts or clamps 16 while thin film head 12 connects to WSM 10 via a gimbal 18. As discussed earlier, a flexible circuit 20 is bonded to rigid arm 14 (hereinafter "the arm flexible circuit"). Flexible circuit 20 provides conductive leads for an electrical path for the transmission of signals between the thin film head 12 and the electronics in the disc system control (not shown).

Arm flexible circuit 20 and thin film head 12 are electrically interconnected via a plurality of small fine wires which are generally twisted in a bundle and are shown at 22 in FIG. 1. Wires 22 are soldered to arm flexible circuit at solder pads 24 and are also soldered to thin film head 12 at 26. As discussed in detail above, the use of a plurality of fine wires 22 for effecting electrical contact between thin film head 12 and arm flex circuit 20 suffers from many deficiencies and problems. For example, assembly costs are high due to the difficulty in working with such small wires. The wires 22 are fragile and easily damaged during assembly and repair. Accordingly, often the entire assembly is simply thrown away because of the difficulty in repair or damage which may occur during repair. Another important problem with the use of small wires in the prior art is that the wire bundle has undesirable electrical properties for signal transmission. Also, the soldering and unsoldering of the connections (which is labor intensive) also contributes to undesirable contamination in the sealed chassis commonly known as the head disc assembly (HDA).

The present invention overcomes these problems by replacing the plurality of fine, bundled wires with a flexible circuit bonded to WSM 10 and which electrically connects to arm flexible circuit 20 via an elastomeric solderless connection of the type described in U.S. Pat. No. 4,468,074.

Referring now to FIGS. 2A and 3, a bottom view of a WSM, similar to WSM 10 in FIG. 1, is shown generally at 28. It will be appreciated that the bundle of wires identified at 22 in FIG. 1 is replaced in FIGS. 2A and 3 by a controlled impedance flexible circuit 30 which is bonded to either the top surface 31 or bottom surface 32 of WSM 28. Preferably, as shown in FIGS. 2A and 3, the flexible circuit 30 will fit into or be seated on an existing space (the space which now supports the bundle of wires) within the WSM on the bottom surface 32 thereof. It will be appreciated that a window or opening 33 would have to be provided in FIG. 2A to permit circuit 30 access to the contact area on the side of head 12′ (See FIG. 1). Alternatively, the flex circuit 30 may be folded over WSM 28 as shown in FIG. 2B in order to more easily affect connection between flex circuit 30 and head 12′. Also in a preferred embodiment, a contaminate free adhesive material would be used to bond flex circuit 30 to WSM 32.

Flexible circuit 30 is comprised of a suitable flexible substrate material 34 such as a polyimide film and has a plurality of conductive traces 36 thereon which terminate at solder pads 38 and 40 on either end of substrate 34. It will be appreciated that a microstrip configuration will be formed by using the conductive WSM 28 as a ground plane for the flexible circuit 30. It will also be appreciated that a controlled impedance $Z_0$ may be achieved by selecting the proper geometry for the flexible circuit 30.

Preferably, flexible circuit 30 should be as thin as possible so as not to disturb the spring constant of WSM 28. It may be necessary to use a flexible spacer of controlled dielectric constant between the WSM 10 and flex circuit 30 to provide greater separation from WSM 10 and the flex circuit 30 conductors so as to raise the characteristic impedance. Also, flexible circuit 30 may be comprised of materials having a lower dielectric constant than commonly used polyimides (such as Du-Pont's Kapton) which could be employed to reduce the necessary thickness of the flexible circuit to achieve a given characteristic impedance. It will be appreciated that WSM 28 necessitates a dynamic flexible circuit application since the WSM 28 slightly flexes during normal use.

The electrical connection between flexible circuit 30 and thin film head 12′ may utilize a suitable soldering or electrical bonding method since the connection is permanent. It will be appreciated, however, that a solderless connection may also be used between head 12′ and flexible circuit 30.

In accordance with the present invention and with reference to FIG. 3, a matched impedance, elastomeric solderless connection of the type described in U.S. Pat. No. 4,468,074 is used in conjunction with flexible circuit 30 to effect electrical connection between flex circuit 30 and the arm flex circuit 39 on arm 41. The solderless connection is accomplished by aligning the contact pads 38 of flexible circuit 30 over corresponding contact pads 42 on arm flex circuit 39 via the alignment and bolt holes 44 in WSM 28. Next, a resilient elastomeric material is provided onto one or both surfaces of the flexible circuits 39 and 30 such as is shown at 46 in FIG. 3. Flex circuits 30 and 39 are then clamped together via bolts or clamps 48 provided in bolt and alignment holes 44 whereupon pressure is evenly exerted against elastomeric pad 46 to provide reliable electrical connection. Note that the construction of the present invention shown in FIG. 3 allows use of existing bolt holes 49 in arm 41 and bolt holes 44 in WSM 28 as bolt or clamp 48 acts to both attach WSM 28 to arm 41, as well as to provide pressure to elastomeric element 46 and contact pads 38 and 42. Thus, during assembly, the WSM 28 and arm 41 effectively act as two sides of a rigid clamp which exert pressure on the elastomeric pads on either side of the flexible circuits 30 and 39. In order to provide an additional locational reference for WSM 28 and repetitive compression of elastomer 46, stops 51 are provided to the system for proper alignment of the flexible circuits 30 and 39 (see FIG. 3). Preferably, contact pads on flexible circuits 30 and 39, and the associated clamping surfaces would be designed to achieve a matched impedance connection to the flex circuits so as to avoid any undesirable discontinuities.

It will be appreciated that the solderless type connection described above will permit reliable disassembly during repair. Accordingly, if a thin film head fails, repair would be easily accomplished by unbolting the WSM assembly and replacing it with a new WSM assembly; unlike the prior art wherein a plurality of tiny wires had to be soldered which for all practical purposes precluded repair and necessitated that the entire assembly be thrown away.

Figure 5:
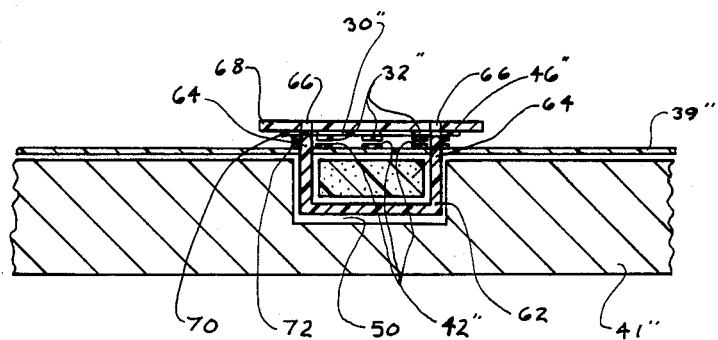
FIG. 5 is a cross-sectional elevation view, similar to FIG. 4, of yet another embodiment of interconnecting the data/servo mechanism to the magnetic head in accordance with the present invention.

Because of the small dimensions of the circuit widths and spaces on a flexible circuit such as shown at 30 in FIGS. 2 and 3, alignment between the circuit traces on the WSM flexible circuit 30 and on the arm flexible circuit 39 may be very difficult to achieve. In FIGS. 4 and 5, several preferred embodiments of the present invention are shown wherein precise registration between the two flexible circuits 30 and 39 is achieved by using the conductive traces themselves to locate one or more circuit traces on the other circuit. Turning first to FIG. 4, in a first of these preferred embodiments, rigid arm 41' is provided with a cavity 50 and a pair of alignment pin holes 52. A resilient elastomeric pad 46' is disposed within cavity 50 between the base of cavity 50 and arm flexible circuit 39'. Unlike the embodiment of the present invention as shown in FIG. 3, in the FIG. 4 embodiment, an independent flat pressure plate 54 having a pair of alignment pins 56 extending therefrom is used to exert pressure against WSM flexible circuit 30', arm flexible circuit 39' and elastomeric element 46'. It will be appreciated that alignment holes 52 are sized to receive alignment pins 56 (which extend from pressure plate 54.)

An important feature of the embodiment of the present invention shown in FIG. 4 is that the two outer conductive tracers 58 and 60 on flexible circuits 30' and 39', respectively, will actually bear up against alignment pins 56. Thus, with the outer conductors bearing against pins 56, conductive traces 32' and 42' on flex circuits 30' and 39' will be in precise registration with one another prior to electrical connection. It will be appreciated that after pressure plate 54 is seated into place i.e., when alignment pins 56 are received by alignment openings 52, a nut or some other means (not shown) may be used to secure alignment pins 56 and pressure plate 52 in place on arm 41'. It should be understood that since alignment pins 56 will be touching the edges of end traces 58 and 60, pins 56 should be comprised of a nonconductive and preferably polymeric material. Note that pressure plate 54 may or may not be comprised of such an electrically nonconductive material.

In FIG. 5, another embodiment of the present invention wherein the circuit traces 32" and 42" on the arm flexible circuit 30" and the WSM flexible circuit 39" are used to effect precise registration of the circuit traces is shown. Thus, in FIG. 5, arm 41" is again provided with a cavity 50'. However, unlike the embodiment of FIG. 4, in FIG. 5, no alignment openings are necessary in arm 50'. Instead, a U-shaped alignment pin 62 is disposed in cavity 50' and includes opposed upright portions 64 which are received by a pair of openings 66 in pressure plate 68. If desired, WSM flexible circuit 30" may be bonded or otherwise attached to pressure plate 68 while elastomeric element 46" is disposed between U-shaped alignment member 62 and arm flexible circuit 39".

An important feature of the embodiment of FIG. 5 is that alignment or dummy pads 70 and 72 are respectively provided along the outer periphery of each flexible circuit 30" and 39". These alignment or dummy pads 70 and 72 are electrically inactive traces and are provided solely for the purpose of ensuring proper registration between conductive traces 32" on flexible circuit 30" and conductive traces 42" on flexible circuit 39". This precise alignment provided by dummy traces 70 and 72 are similar to the alignment provided by outer traces 58 and 60 in FIG. 4 in that traces 70 and 72 abut or bear up against extending pins 64 of U-shaped member 62. Such dummy traces 70 and 72 may be formed at the same time the other conductive traces are etched or otherwise formed.

It is believed that the self-aligning embodiment of FIG. 5 is preferable to the self-aligning embodiment of FIG. 4 in that the FIG. 5 embodiment precludes having to provide alignment openings 52 in arm 41". Also, extending alignment pins 64 may be comprised of either a conductive or nonconductive material since alignment dummy traces 70 and 72 are electrically inactive.

It will be appreciated that while FIGS. 3–5 show several methods of effecting the solderless connection between WSM flexible circuit 30 and arm flexible circuit 39, the present invention includes any other type of connection so long as the connection is of the solderless type (i.e., utilizing an elastomeric element in combination with a mechanical means which provides force to the elastomeric element). Thus, the actual solderless connector structures shown in FIGS. 3–5 are by way of example only.

In accordance with the present invention, the material which defines the resilient elastomeric element or pad 46 of FIG. 3, 46' of FIG. 4, and 46" of FIG. 5 preferably consists of an open celled visco-elastic polymer and, in the preferred embodiment, a polyurethane foam. Particularly good results have been obtained employing a urethane formulation comprising a mixed polyester/polyether system. One open cell material suitable for use in the practice of the present invention is FCD 2200 obtainable from Rogers Corporation. This material is characterized by a compressive load deflection at 25% compression in the range of 5 to 50 psi. A resilient material for use in the present invention is preferably characterized by a compression set of less than 5%. The compression set is tested in accordance with ASTM standard D-1564 wherein a two inch square and one inch thick stack of sheets of material (about 60 mils/sheet) are compressed 50% to ½ inch thickness, the compressed material is subjected to 158° F. for 22 hours, the compression is released and the thickness is measured. The compression set of the FCD 2200 material after 5 hours of steam autoclaving prior to performing test ASTM D-1564 is less than 10%.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A solderless connection between a data/servo flex circuit and a magnetic head in a disc drive comprising;
   a rigid arm controlled by an electro-mechanical servo mechanism;
   first flexible circuit means on said rigid arm, said first flexible circuit means including a first substrate having a first conductive pattern means thereon;
   suspension arm means having a first end and a second end, said first end being detachably connected to said rigid arm;
   magnetic head disc means being attached to said second end of said suspension arm means;
   second flexible circuit means on said suspension arm means having a first end and a second end, said second flexible circuit means including a second substrate having a second conductive pattern means thereon, said second conductive pattern means extending between and terminating at said first and second ends of said second flexible circuit means defining first and second terminal portions;

said second terminal portion being electrically connected to said magnetic head disc means;
said first terminal portion being detachably connected to said first conductive pattern means on said first flexible circuit means via a first solderless connection wherein said first solderless connection comprises;
mechanical force applying means wherein said mechanical force applying means comprises a rigid plate means having a pair of alignment pins extending therefrom;
elastomeric element means wherein said mechanical means applies force against said elastomeric element means to effect electrical contact between said first terminal portion and said first conductive pattern means on said first flexible circuit means;
a cavity in said rigid arm;
a pair of alignment holes in said cavity, said alignment holes adapted to receive said alignment pins; and
said elastomeric element means being disposed in said cavity.

2. The solderless connector of claim 1 wherein said mechanical force applying means comprises a rigid plate means having a pair of alignment pins extending therefrom; and further including;
a cavity in said rigid arm;
a pair of alignment holes in said cavity, said alignment holes adapted to receive said alignment pins; and
said elastomeric element means being disposed in said cavity.

3. The solderless connector of claim 1 wherein:
said first and second pattern means comprises conductive traces, the outermost conductive traces being adapted to bear up against said alignment pins when said first solderless connection is made whereby precise registration between said first and second pattern means is effected.

4. The solderless connector of claim 3 wherein:
said alignment pins are electrically nonconductive.

5. The solderless connector of claim 1 wherein:
said alignment pins are electrically nonconductive.

6. The solderless connector of claim 1 including:
alignment stops for aligning said first and second conductive pattern means.

7. The solderless connector of claim 1 wherein:
said second terminal portion is electrically connected to said magnetic head disc means via a solder connection.

8. The solderless connector of claim 1 wherein:
said second terminal portion is electrically connected to said magnetic head disc means via a second solderless connection.

9. The solderless connector of claim 1 wherein:
said second flexible circuit means is adhesively bonded to said suspension arm means.

10. The solderless connector of claim 1 wherein:
said suspension arm means includes opposing top and bottom surfaces; and wherein
said second flexible circuit means is mounted on said top surface.

11. The solderless connection of claim 1 wherein:
said suspension arm means includes opposing top and bottom surfaces; and wherein
said second flexible circuit means is mounted on said bottom surface.

12. The solderless connection of claim 11 including:
a window through said suspension arm means;
said second flexible circuit means being inserted through said window for access to said magnetic head disc means.

13. The solderless connection of claim 11 wherein:
a portion of said second flexible circuit means is folded over said suspension arm means for access to said magnetic head disc means.

14. a solderless connection between a data/servo flex circuit and a magnetic head in a disc drive comprising:
a rigid arm controlled by an electro-mechanical servo mechanism;
first flexible circuit means on said rigid arm, said first flexible circuit means including a first substrate having a first conductive pattern means thereon;
suspension arm means having a first end and a second end, said first end being detachably connected to said rigid arm;
magnetic head disc means being attached to said second end of said suspension arm means;
second flexible circuit means on said suspension arm means having a first end and a second end, said second flexible circuit means including a second substrate having a second conductive pattern means thereon, said second conductive pattern means extending between and terminating at said first and second ends of said second flexible circuit means defining first and second terminal portions;
said second terminal portion being electrically connected to said magnetic head disc means;
said second terminal portions being electrically connected to said magnetic head disc means;
said first terminal portion being detachably connected to said first conductive pattern means on said first flexible circuit means via a first solderless connection wherein said first solderless connection comprises;
mechanical force applying means wherein said mechanical force applying means comprises a rigid plate means having a pair of openings therethrough;
elastomeric element means wherein said mechanical means applies force against said elastomeric element means to effect electrical contact between said first terminal portion and said first conductive pattern means on said first flexible circuit means;
a cavity in said rigid arm; and
an alignment member having a pair of extensions adapted to be received by said pair of openings, said alignment member being adapted to seat in said cavity;
said elastomeric element being disposed in said cavity.

15. The solderless connector of claim 14 wherein:
said first and second pattern means comprises conductive traces, the outermost conductive traces being electrically inactive dummy traces adapted to bear up against said extensions from said alignment member when said first solderless connection is made whereby precise registration between said first and second pattern means is effected.

16. The solderless connector of claim 14 wherein said alignment member has a U-shape.

17. The solderless connector of claim 15 wherein said alignment member has a U-shape.

18. The solderless connector of claim 14 including:
alignment stops for aligning said first and second conductive pattern means.

19. The solderless connector of claim 14 wherein:

said second terminal portion is electrically connected to said magnetic head disc means via a solder connection.

20. The solderless connector of claim 14 wherein:
said second terminal portion is electically connected to said magnetic head disc means via a second solderless connection.

21. The solderless connector of claim 14 wherein:
said second flexible circuit means is adhesively bonded to said suspension arm means.

22. The solderless connector of claim 14 wherein:
said suspension arm means includes opposing top and bottom surfaces; and wherein
said second flexible circuit means is mounted on said top surface.

23. The solderless connection for claim 14 wherein:
said suspension arm means includes opposing top and bottom surfaces; and wherein
said second flexible circuit means is mounted on said bottom surface.

24. The solderless connection of claim 23 including:
a window through said suspension arm means;
said second flexible circuit means being inserted through said window for access to said magnetic head disc means.

25. The solderless connection of claim 23 wherein:
a portion of said second flexible circuit means is folded over said suspension arm means for access to said magnetic head disc means.

26. A solderless connection between a pair of circuit devices comprising:
a first rigid member;
first flexible circuit means on said rigid member, said first flexible circuit means including a first substrate having a first conductive pattern means thereon;
a second rigid member;
second flexible circuit means on said second rigid member, said second flexible circuit means including a second substrate having a second conductive pattern means thereon, said second conductive pattern means terminating at a terminal portion;
said terminal portion being detachably connected to said first conductive pattern means on said first flexible circuit means via a solderless connection wherein said solderless connection comprises;
mechanical force applying means wherein said mechanical force applying means comprises a rigid plate means having a pair of alignment pins extending therefrom;
elastomeric element means wherein said mechanical means applies force against said elastomeric element means to effect electical contact between said first terminal portion and said first conductive pattern means on said first flexible circuit means;
a cavity in said rigid arm;
a pair of alignment holes in said cavity, said alignment holes adapted to receive said alignment pins; and
said elastomeric element means being disposed in said cavity.

27. The solderless connector of claim 26 wherein:
said first and second pattern means comprises conductive traces, the outermost conductive traces being adapted to bear up against said alignment pins when said solderless connection is made whereby precise registration between said first and second pattern means is effected.

28. The solderless connector of claim 27 wherein:
said alignment pins are electrically nonconductive.

29. The solderless connector of claim 26 wherein:
said alignment pins are electrically nonconductive.

30. A solderless connection between a pair of circuit devices comprising:
a first rigid member;
first flexible circuit means on said rigid member said first flexible circuit means including a first substrate having first conductive pattern means thereon;
a second rigid member;
second flexible circuit means on said second rigid member, said second flexible circuit means including a second substrate having a second conductive pattern means thereon, said second conductive pattern means terminating at a terminal portion;
said terminal portion being detachably connected to said first conductive pattern means on said first flexible circuit means via a solderless connection wherein said solderless connection comprises;
mechanical force applying means wherein said mechanical force applying means comprises a rigid plate means having a pair of openings therethrough;
elastomeric element means wherein said mechanical means applies force against said elastomeric element means to effect electrical contact between said first terminal portion and said first conductive pattern means on said first flexible circuit means;
a cavity in said rigid arm; and
an alignment member having a pair of extensions adapted to be received by said pair of openings, said alignment member being adapted to seat in said cavity;
said elastomeric element being disposed in said cavity.

31. The solderless connector of claim 30 wherein:
said first and second pattern means comprises conductive traces, the outermost conductive traces being electrically inactive dummy traces adapted to bar up against said extensions from said alignment member when said first solderless connection is made whereby precise registration between said first and second pattern means is effected.

32. The solderless connector of claim 30 wherein said alignment member has a U-shape.

33. The solderless connector of claim 31 wherein said alignment member has a U-shape.

* * * * *